United States Patent [19]

Ishikawa et al.

[11] Patent Number: 5,523,725
[45] Date of Patent: Jun. 4, 1996

[54] SIGNAL-TO-NOISE ENHANCER

[75] Inventors: Youhei Ishikawa; Takekazu Okada; Satoru Shinmura; Fumio Kanaya; Shinichiro Ichiguchi; Toshihito Umegaki, all of Kyoto-fu; Toshihiro Nomoto, Tokyo-to, all of Japan

[73] Assignees: Murata Manufacturing Co., Ltd., Kyoto-fu; Nippon Hoso Kyokai, Tokyo-to, both of Japan

[21] Appl. No.: 395,762

[22] Filed: Feb. 28, 1995

[30] Foreign Application Priority Data

Mar. 3, 1994 [JP] Japan .................................. 6-059900

[51] Int. Cl.$^6$ .................................................. H04B 1/10
[52] U.S. Cl. .......................... 333/17.2; 333/166; 333/201; 455/306
[58] Field of Search ...................... 333/110, 113, 333/116, 117, 120, 172, 24 R, 201; 455/226.3, 303, 306–308

[56] References Cited

U.S. PATENT DOCUMENTS

| | | | |
|---|---|---|---|
| 3,058,070 | 10/1962 | Reingold et al. | 333/109 |
| 5,307,516 | 4/1994 | Nomoto | 333/17.2 X |
| 5,319,325 | 6/1994 | Konishi | 333/109 X |
| 5,323,126 | 6/1994 | Spezio et al. | 333/109 |

*Primary Examiner*—Paul Gensler
*Attorney, Agent, or Firm*—Jordan and Hamburg

[57] ABSTRACT

A signal-to-noise enhancer 10 includes a first 90 degree hybrid set 20. A first output end of the first 90 degree hybrid set 20 is connected to an input end of a limiter used a magnetostatic wave element 62a utilized the magnetostatic surface wave mode. Also, a second output end of the first 90 degree hybrid set 20 is connected to an input end of a filter used a magnetostatic wave element 62b similar to the magnetostatic wave element 62a in structure, via a resistor 32 as a first attenuator. Furthermore, an output end of the limiter is connected to a first input end of a second 90 degree hybrid set 40 via a resistor 52 as a second attenuator. Also, an output end of the filter is connected to a second input end of the second 90 degree hybrid set 40.

9 Claims, 7 Drawing Sheets

SIGNAL-TO-NOISE ENHANCER

BACKGROUND OF THE INVENTION

1. Field of the Invention

The present invention relates to a signal-to-noise enhancer, and more particularly, to a signal-to-noise enhancer which has a limiter for limiting an amplitude of a main signal in an input signal, which improves a ratio of the main signal to noise (S/N) in the input signal, and which is used for receiving, for example, a satellite broadcasting signal.

2. Description of the Prior Art

An example of the conventional signal-to-noise enhancers is disclosed in Japanese Patent Provisional Publication No. 123502/1992. FIG. 11 is a circuit diagram showing an example of the conventional signal-to-noise enhancers. The signal-to-noise enhancer 1 shown in FIG. 11 includes an input terminal 2. The input terminal 2 is connected to an input end of a directional coupler 3 used as a divider. The directional coupler 3 divides the input signal applied to the input terminal 2 into a high-level signal, which is almost the same in level as the input signal, and a low-level signal which is at a lower level than the input signal by, for example, 30 dB.

Two output ends of the directional coupler 3 are connected to inputs of two magnetostatic wave filters 4 and 5 utilizing the magnetostatic surface wave mode, respectively. These magnetostatic wave filters 4 and 5 have the same frequency-selective nonlinear limiting characteristics. The frequency-selective nonlinear limiting characteristic is a characteristic wherein a signal at a frequency f1 is limited in excess of a saturation level, while a signal at a frequency f2, which is different from the frequency f1, having the saturation level or less is not limited. That is, the frequency-selective nonlinear limiting characteristic is a characteristic wherein when a signal is over a saturation level, a saturation operation is generated, and limiting by the saturation operation is individually generated at each frequency. One magnetostatic wave filter 4 is used as a limiter for limiting an amplitude of a high-level main signal in the high-level signal obtained from the directional coupler 3. The other magnetostatic wave filter 5 is used for passing the low-level signal obtained from the directional coupler 3.

An output of the magnetostatic wave filter 4 is connected to an input of an attenuator 6. The attenuator 6 is for attenuating a level of a signal obtained from the magnetostatic wave filter 4. An output of the other magnetostatic wave filter 5 is connected to an input of a delay line 7. The delay line 7 delays a phase of a signal obtained from the magnetostatic wave filter 5. An output of the attenuator 6 and an output of the delay line 7 are connected to two inputs of a directional coupler 8 used as a combiner, respectively. The directional couple 8 is for attenuating a level of a signal obtained from the attenuator 6, and is for combining the signal having the attenuated level and a signal obtained from the delay line 7. Finally, an output of the directional coupler 8 is connected to an output terminal 9.

Thus, in the signal-to-noise enhancer 1, between the input terminal 2 and the output terminal 9, a first path is composed of the directional coupler 3, the magnetostatic wave filter 4, the attenuator 6 and the directional coupler 8, and a second signal path is composed of the directional coupler 3, the magnetostatic wave filter 5, the delay line 7 and the directional coupler 8.

In the signal-to-noise enhancer 1, when an input signal including a high-level main signal and a low-level noise different from the main signal in frequency is applied to the input terminal 2, the input signal is divided by the directional coupler 3 into a high-level signal which is almost the same in level as the input signal and a low-level signal which is less in level than the input signal by, for example, 30 dB. In this case, the high-level signal includes a high-level main signal and a low-level noise different from each other in frequency, the low-level signal includes a low-level main signal and a lower-level noise different from each other in frequency.

In the magnetostatic wave filter 4, though the main signal in the high-level signal is limited because the main signal has a high-level, the noise in the high-level signal is not limited because the noise is different from the main signal in frequency and has a low-level. On the other hand, in the other magnetostatic wave filter 5, the main signal and the noise in the low-level signal are not limited at low-levels. Meanwhile, due to insertion loss in the magnetostatic wave filters 4 and 5, the high-level signal and the low-level signal are slightly attenuated in level, respectively.

A level of a signal obtained from the magnetostatic wave filter 4 is attenuated by the attenuator 6, a phase of a signal obtained from the other magnetostatic wave filter 5 is delayed by the delay line 7. Then, in the directional coupler 8, a level of a signal obtained from the attenuator 6 is attenuated, and the signal having the attenuated level and a signal obtained from the delay line 7 are combined. In this case, the level of the signal obtained from the magnetostatic wave filter 4 is attenuated by the attenuator 6 and the phase of the signal obtained from the magnetostatic wave filter 5 is delayed by the delay line 7 so that noise in the two signals combined by the directional coupler 8 are at the same level and opposite in phase. Thus, the noise from the first signal path, including the magnetostatic wave filter 4, and the noise from the second signal path, including the magnetostatic wave filter 5, offset each other in the directional coupler 8. Also, though the main signal from the first signal path is limited by the magnetostatic wave filter 4, the main signal from the second signal path in not limited by the magnetostatic wave filter 5. Thus, from the output of the directional coupler 8 and the output terminal 9, a main signal having a level corresponding to the limited level is obtained. Accordingly, in the signal-to-noise enhancer 1, the signal-to-noise ratio in the input signal is improved.

Also, in the signal-to-noise enhancer 1, the minimum level of the input signal wherein the signal-to-noise ratio is improved is −12 dBm, the level of the input signal wherein it begins to improve the signal-to-noise ratio is −19 dBm, the different between these levels is small as 7 dB, therefore a great effect on improving of the signal-to-noise ratio of noisy signals is obtained on receiving, for example, a satellite broadcasting signal. However, in the signal-to-noise enhancer 1, since the phase difference between the first signal path and the second signal path is set to 180 degree by using the delay line 7, an operating frequency bandwidth having a desired enhancement, for example 20 dB or more is narrow as about 100 MHz (Toshihiro Nomoto, Yoshihiro Matsushita, "A Signal-to-Noise Enhancer Using Two MSSW Filters and its Application to Noise Reduction in DBS Reception", IEEE Trans. MTT-41, 8, PP. 1316–1321 (1993)). Thus, the signal-to-noise enhancer 1 can not cover the bandwidth of about 300 MHz which is the bandwidth of all the satellite broadcasting signals received in Japan. Accordingly, the signal-to-noise enhancer 1 can not collectively improve the signal-to-noise ratio in the signals of all the channels for receiving the satellite broadcasting in Japan.

Furthermore, in the signal-to-noise enhancer 1, since the operating frequency bandwidth is narrow as above-mentioned, when the temperature changes, the operating frequency bandwidth changes and easily drifts out of the frequency range desired. Additionally, it is difficult to adjust the operating frequency bandwidth so that the used frequency is within the operating frequency bandwidth, thus, it requires many hours, for example, 2–3 hours to adjust the operating frequency bandwidth.

SUMMARY OF THE INVENTION

Accordingly, it is a primary object of the present invention to provide a signal-to-noise enhancer having a wide operating frequency bandwidth.

The present invention is directed to a signal-to-noise enhancer comprising a first hybrid set for dividing an input signal including a main signal and noise into a first signal and a second signal, the first signal and the second signal having a first phase difference in a wide bandwidth, a limiter, provided to the post-stage of the first hybrid set, for limiting an amplitude of a main signal in the first signal, and a second hybrid set, provided to the post-stage of the limiter and the first hybrid set, for combining a signal obtained from the limiter and the second signal obtained from the first hybrid set with a second phase difference in a wide bandwidth, wherein the sum of the first phase difference and the second phase difference is (2n+1)·180 degree where n is 0 or an integer.

In the signal-to-noise enhancer according to the present invention, the first hybrid set and the second hybrid set are one of, for example, a first 90 degree hybrid set and a second 90 degree hybrid set, a 0 degree hybrid set and a 180 degree hybrid set, or a 180 degree hybrid set and a 0 degree hybrid set can be used. However, for the reason described in the latter part, it is preferable to use 90 degree hybrid sets as the first hybrid set and the second hybrid set.

Furthermore, in the signal-to-noise enhancer according to the present invention, a filter such as a low-pass filter, a high-pass filter, a band-pass filter and a band-stop filter, consisting of a magnetostatic wave element, can be used as the limiter. However, it is preferable to use a magnetostatic wave element in the limiter for the reason described below. In this case, as the magnetostatic wave element, it is more preferable to use a magnetostatic wave element operating in magnetostatic surface wave mode for the reason described below.

Further still, for the reason described below, it is preferable that the signal-to-noise enhancer according to the present invention comprises a level adjusting means, provided between the first hybrid set and the second hybrid set, for equalizing levels of noises in two signals combined by the second hybrid set each other. The level adjusting means comprises, for example, a first attenuator, provided between the first hybrid set and the second hybrid set, for attenuating a level of the second signal obtained from the first hybrid set, a filter, provided between the first attenuator and the second hybrid set, having the same input-to-output characteristic as the limiter, for passing a signal obtained from the first attenuator, and a second attenuator, provided between the limiter and the second hybrid set, for attenuating a level of a signal obtained from the limiter.

In the signal-to-noise enhancer according to the present invention, it is preferable to use, for example, a signal-to-noise enhancer comprising a first 90 degree hybrid set for dividing an input signal including a main signal and noise into a first signal and a second signal, the first signal and the second signal having a phase difference of 90 degree in a wide bandwidth, a limiter, provided to the post-stage of the first 90 degree hybrid set, using a magnetostatic wave element utilized the magnetostatic surface wave mode, for limiting an amplitude of a main signal in the first signal, a first attenuator, provided to the post-stage of the first 90 degree hybrid set, for attenuating a level of the second signal, a filter, provided to the post-stage of the first attenuator, using a magnetostatic wave element utilized the magnetostatic surface wave mode, having the same input-to-output characteristic as the limiter, for passing a signal obtained from the first attenuator, a second attenuator, provided to the post-stage of the limiter, for attenuating a level of a signal obtained from the limiter, and a second 90 degree hybrid set, provided to the post-stage of the second attenuator and the filter, for combining a signal obtained from the second attenuator and a signal obtained from the filter with a phase difference of 90 degree in a wide bandwidth, wherein levels of noises in two signals combined by the second 90 degree hybrid set are equalized by the first attenuator, the filter and the second attenuator, and a phase difference between the two signals combined by the second 90 degree hybrid set is set by the first 90 degree hybrid set and the second 90 degree hybrid set to (2n+1)·180 degree where n is 0 or an integer.

The input signal including the main signal and the noise is divided by the first hybrid set into the first signal and the second signal having the first phase difference in the wide bandwidth. In this case, each the first signal and the second signal includes the main signal and the noise. Also, the main signal in the first signal is limited by the limiter.

Furthermore, the signal obtained from the limiter and the second signal obtained from the first hybrid set are combined by the second hybrid set with the second phase difference in the wide bandwidth. In this case, the sum of the first phase difference and the second phase difference is (2n+1)·180 degree where n is 0 or an integer. Thus, the two signals combined by the second hybrid set become opposite phase to each other in the wide bandwidth.

Accordingly, the noises in the two signals combined by the second hybrid set are offset in the wide bandwidth. Furthermore, from the output of the second hybrid set, the main signal corresponding to the level limited by the limiter is obtained.

According to the present invention, since the two signals combined by the second hybrid set are opposite in phase to each other in the wide bandwidth, a signal-to-noise enhancer wherein an operating frequency bandwidth having a desired enhancement, for example, 20 dB or more is obtained over a wide bandwidth, for example, about 350 MHz. Thus, the signal-to-noise enhancer according to the present invention, when receiving a satellite broadcasting signal, can completely cover the bandwidth of about 300 MHz which is the bandwidth of all the satellite broadcasting signals received in Japan.

According to another feature of the signal-to-noise enhancer of the present invention, since the operating frequency bandwidth is wide, when the temperature changes, even if the operating frequency bandwidth changes, the operating frequency bandwidth rarely falls out of the desired frequency range. Furthermore, it is easy to adjust the operating frequency bandwidth to maintain the desired frequency within the operating frequency bandwidth, since only a short time is required to adjust the operating frequency bandwidth.

In the present invention, when the 90 degree hybrid sets are used as the first hybrid set and the second hybrid set, since the same hybrid sets can be manufactured for the first hybrid set and the second hybrid set, the efficiency of manufacturing the first hybrid set and the second hybrid set is increased.

Also, in the present invention, when the magnetostatic wave element is used in the limiter, since a signal in a wider bandwidth is limited by the limiter, a signal in a wider bandwidth is applicable.

Accordingly, in the present invention, when the magnetostatic wave element operating in the magnetostatic surface wave mode is used in the limiter, since the minimum level of the main signal limited by the limiter, that is, the saturation level of the limiter becomes low, even if the level of the main signal is low, the signal-to-noise ratio in the input signal is improved.

Furthermore, in the preset invention, when comprising the level adjusting means, since the levels of the noises in the two signals combined by the second hybrid set are equalized by the level adjusting means, these noises are further offset. Thus, the signal-to-noise ratio can be further improved.

The above and other objectives, features, aspects and advantages of the present invention will become more apparent from the following detailed description of the embodiment with reference to the accompanying drawings.

DESCRIPTION OF THE PREFERRED EMBODIMENTS

Figure 1:
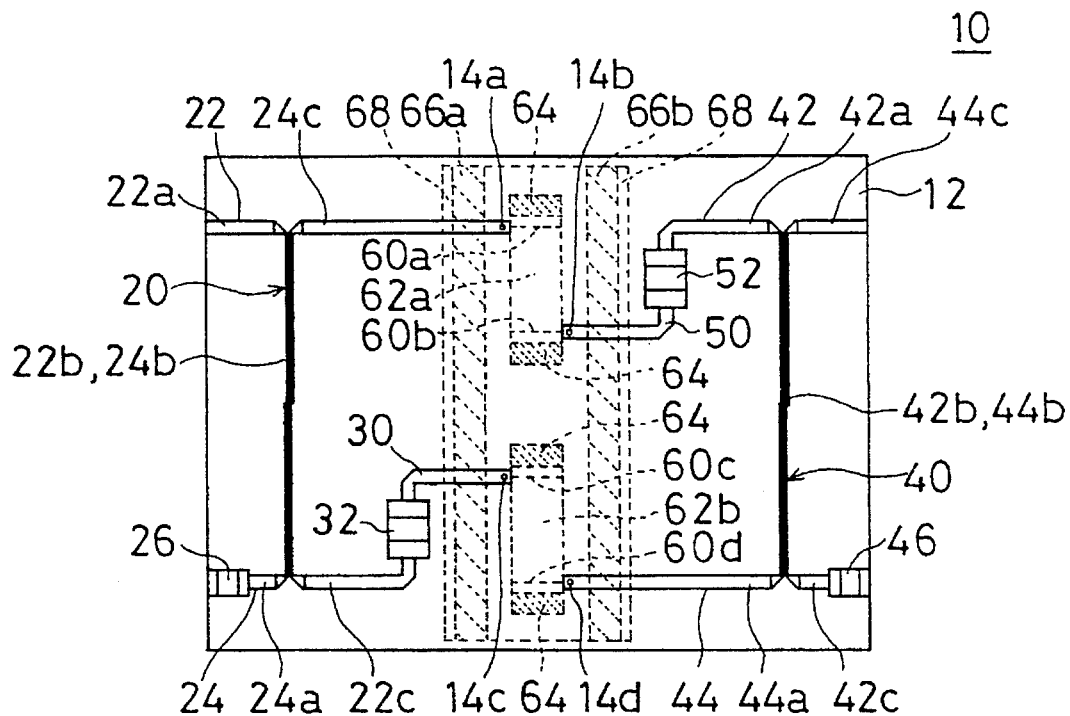
FIG. 1 is a plan view showing an embodiment of the present invention.
Figure 2:
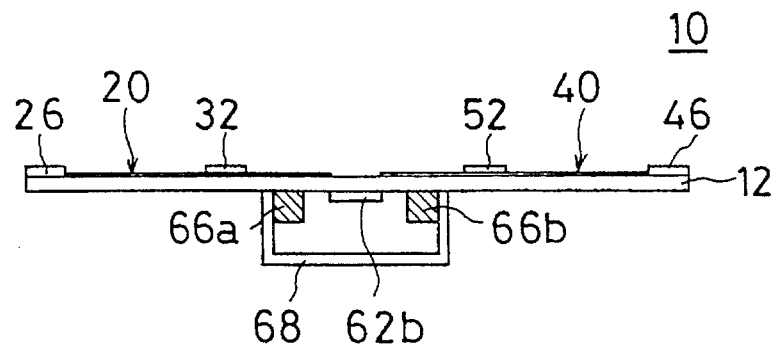
FIG. 2 is a front view of the embodiment shown in FIG. 1.

FIG. 1 is a plan view showing an embodiment of the present invention, FIG. 2 is a front view thereof. The signal-to-noise enhancer 10 includes, for example, a rectangular substrate 12 consisting of a dielectric material such as synthetic resin and ceramic.

Four through-holes 14a, 14b, 14c and 14d are formed in the substrate 12. In this case, the two through-holes 14a and 14c are formed a little off to one side from the central line perpendicular to the long side of the substrate 12, the other two through-holes 14b and 14d are formed a little off to the other side from the central line perpendicular to the long side of the substrate 12. Also, the through-hole 14a is formed near one long side of the substrate 12, the through-hole 14b is formed a little off to one side from the central line perpendicular to the short side of the substrate 12, the through-hole 14c is formed a little off to the other side from the central line perpendicular to the short side of the substrate 12, the through-hole 14d is formed near the other long side of the substrate 12.

A first 90 degree hybrid set 20, corresponding to a first hybrid set, is formed from one short side to the center on one main surface of the substrate 12. The first 90 degree hybrid set 20 includes, for example, two bent line electrodes 22 and 24.

Figure 3:
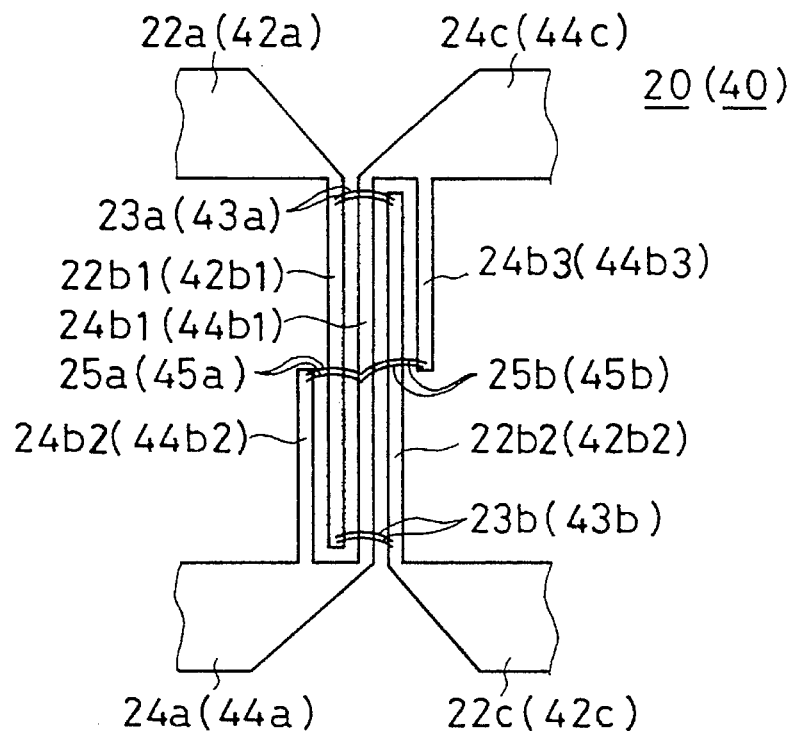
FIG. 3 is a plan view showing an essential part of a first 90 degree hybrid set (a second 90 degree hybrid set) used in the embodiment shown in FIG. 1.
Figure 4:
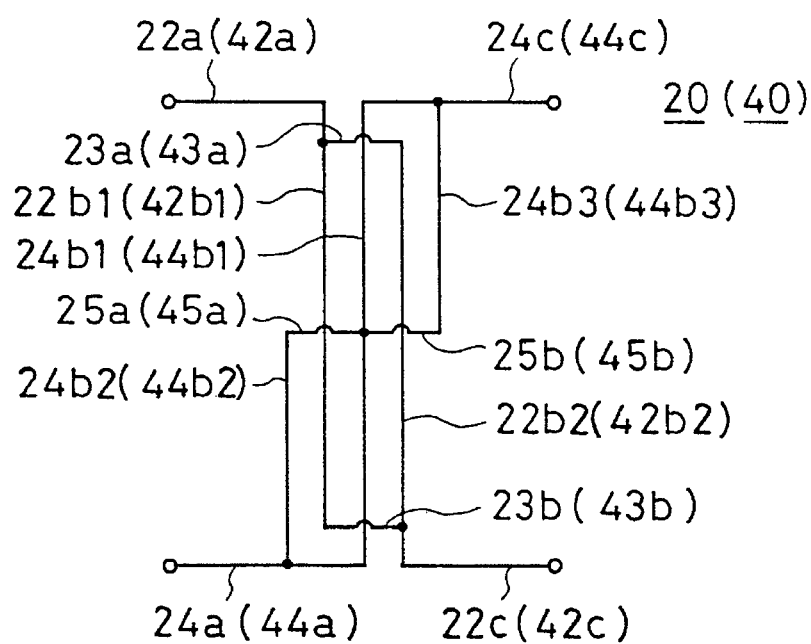
FIG. 4 is a circuit diagram showing an essential part of the first 90 degree hybrid set (a second 90 degree hybrid set) used in the embodiment shown in FIG. 1.

The line electrode 22 consists of a wide end portion 22a extending along the long side from the short side of the substrate 12, an intermediate portion 22b extending along the short side of the substrate 12, and another wide end portion 22c extending along the other long side of the substrate 12. As shown in FIG. 3 and FIG. 4, the intermediate portion 22b of the line electrode 22 includes two thin line portions 22b1 and 22b2 disposed parallel each other separated by an interval. The line portion 22b1 is formed so as to extend from the end portion 22a, the other line portion 22b2 is formed so as to extend from the other end portion 22c. Also, both ends of the line portion 22b1 are electrically connected to both ends of the other line portion 22b2, for example, with two U-shaped lead wires 23a and 23b, such as gold wires or aluminum wires, for example, by wire bonding.

As shown in FIG. 1, the other line electrode 24 consists of a wide end portion 24a extending along the other long side from the short side of the substrate 12, an intermediate portion 24b extending along the short side of the substrate 12, and another wide end portion 24c extending near the through-hole 14a along the long side of the substrate 12. As shown in FIG. 3 and FIG. 4, the intermediate portion 24b of the line electrode 24 includes three thin line portions 24b1, 24b2 and 24b3 formed parallel one another separated by an interval. The line portion 24b1 is formed to extend from the end portion 24a to the other end portion 24c between the two line portions 22b1 and 22b2 of the line electrode 22. Also, the other two line portions 24b2 and 24b3 are formed outside of the line portions 22b1 and 22b2 with half the length of the line portion 24b1 extending from the end portion 24a and the other end portion 24c. Also, the ends of the line portions 24b2 and 24b3 are electrically connected to the center of the line portion 24b1, for example, with two U-shaped lead wires 25a and 25b, such as gold wires or aluminum wires, for example, by wire bonding.

As shown in FIG. 1, one end of a resistor 26 of 50 ohms functioning as a terminator is connected to the end portion 24a of the line electrode 24. The other end of the resistor 26 is grounded.

The above first 90 degree hybrid set 20 is for dividing an input signal including a main signal and noise into a first signal and a second signal having a phase difference of 90 degree in a wide bandwidth, for example, 1.4–2.4 GHz. In this case, in the first 90 degree hybrid set 20, the end portion 22a of the line electrode 22 is used as an input, the other end portion 24c of the line electrode 24 is used as a first output, the other end portion 22c of the line electrode 22 is used as a second output. The input signal applied to the input is divided into the first signal and the second signal having half the level of the input signal at the first output and the second output. The phase of the second signal is later than the phase of the first signal by 90 degree.

Furthermore, on the main surface of the substrate 12, an L-shaped drawing electrode 30 is formed from the neighborhood of the end portion 22c of the line electrode 22 of the first 90 degree hybrid set 20 to the neighborhood of the through-hole 14c. Ends of a resistor 32 of 50 ohms, functioning as a first attenuator, are connected to the end portion 22c and the drawing electrode 30. The resistor 32 attenuates a level of a signal obtained from the second output of the first 90 degree hybrid set 20, for example, by 30 dB.

Also, a second 90 degree hybrid set 40 as a second hybrid set is formed from the center to the other short side on the main surface of the substrate 12. The second 90 degree hybrid set 40 has the same structure as the first 90 degree hybrid set 20.

Accordingly, the second 90 degree hybrid set 40 includes, for example, two bent line electrodes 42 and 44. The line electrode 42 consists of a wide end portion 42a extending along the long side of the substrate 12, an intermediate portion 42b extending along the short side of the substrate 12, and another wide end portion 42c extending along the other long side of the substrate 12. As shown in FIG. 3 and FIG. 4, the intermediate portion 42b of the line electrode 42 includes two thin line portions 42b1 and 42b2 disposed parallel to each other separated by an interval. The line portion 42b1 is formed to extend from the end portion 42a, the other line portion 42b2 is formed to extend from the other end portion 42c. Also, both ends of the line portion 42b1 are connected to both ends of the other line portion 42b2, for example, with two U-shaped lead wires 43a and 43b, such as gold wires or aluminum wires, for example, by wire bonding.

As shown in FIG. 1, the other line electrode 44 consists of a wide end portion 44a extending along the other long side of the substrate 12 from the neighborhood of the through-hole 14d, an intermediate portion 44b extending along the short side of the substrate 12, and another wide end portion 44c extending along the long side of the substrate 12. As shown in FIG. 3 and FIG. 4, the intermediate portion 44b of the line electrode 44 includes three thin line portions 44b1, 44b2 and 44b3 formed parallel one another separated by intervals. The line portion 44b1 is formed to extend from the end portion 44a to the other end portion 44c between the two line portions 42b1 and 42b2 of the line electrode 42. Also, the other two line portions 44b2 and 44b3 are formed outside of the line portions 42b1 and 42b2 at half the length of the line portion 44b extending from the end portion 44a and the other end portion 44c. Also, the ends of the line portions 44b2 and 44b3 are electrically connected to the center of the line portion 44b1, for example, with two U-shaped lead wires 45a and 45b, such as gold wires or aluminum wires, for example, by wire bonding.

As shown in FIG. 1, one end of a resistor 46 of 50 ohms, functioning as a terminator is connected to the end portion 42c of the line electrode 42. The other end of the resistor 46 is grounded.

The above second 90 degree hybrid set 40 is for combining two signals applied thereto with a phase difference of 90 degree over a wide bandwidth, for example, 1.4–2.4 GHz. In this case, in the second 90 degree hybrid set 40, the end portion 42a of the line electrode 42 is used as a first input, the end portion 44a of the line electrode 44 is used as a second input, the other end portion 44c of the line electrode 44 is used as an output. Accordingly, the two signals applied to the first input and the second input of the second 90 degree hybrid set 40 are combined at the output. Thus, when combining the two signals, the phase of the signal applied to the second input end is later than the phase of the signal applied to the first input end by 90 degree.

Furthermore, on the main surface of the substrate 12, an L-shaped drawing electrode 50 is formed from the neighborhood of the end portion 42a of the line electrode 42 of the second 90 degree hybrid set 40 to the neighborhood of the through-hole 14b. Ends of a resistor 52 of 50 ohms, functioning as a second attenuator, are connected to the end portion 42a and the drawing electrode 50. The resistor 52 attenuates a level of a signal applied to the first input of the second 90 degree hybrid set 40, for example, by 30 dB.

On the center of the other main surface of the substrate 12, four transducers 60a, 60b, 60c and 60d, consisting of four line electrodes, are formed along the long side of the substrate 12 from the neighborhood of the through-holes 14a, 14b, 14c and 14d. In this case, ends of the transducers 60a, 60b, 60c and 60d are electrically connected to the end portion 24c of the line electrode 24, the drawing electrode 50, the drawing electrode 30 and the end portion 44a of the line electrode 44 via the through-holes 14a, 14b, 14c and 14d, respectively. Furthermore, the other ends of the transducers 60a–60d are grounded.

Also, on the other main surface of the substrate 12, a magnetostatic wave element 62a is installed on the two transducers 60a and 60b, and another magnetostatic wave element 62b is installed on the other two transducers 60c and 60d. The magnetostatic wave elements 62a and 62b include, for example, two rectangular GGG substrates, two YIG thin films as two ferrimagnetic substrates formed on main surfaces of the GGG substrates, respectively. Then, the magnetostatic wave elements 62a and 62b are installed to oppose the surfaces of the YIG thin films to the other main surface of the substrate 12. On both end parts of the surfaces of the YIG thin films, magnetostatic wave absorbers 64 for absorbing an unnecessary magnetostatic wave reflected in the YIG thin films are formed, respectively.

Furthermore, on the other main surface of the substrate 12, permanent magnets 66a and 66b consisting of, for example, ferrite are installed on both sides of the the magnetostatic wave elements 62a and 62b, respectively. The permanent magnets 66a and 66b are disposed to generate a magnetic field therebetween in the extending direction of the transducers 60a–60d. Thus, a magnetic field is applied to the magnetostatic wave elements 62a and 62b in the extending direction of the transducers 60a–60d. Accordingly, the magnetostatic wave elements 62a and 62b become magnetostatic wave elements operating in the magnetostatic surface wave mode, respectively.

Then, the two transducers 60a and 60b, the magnetostatic wave element 62a and so on are used as a limiter. The limiter has a frequency-selective nonlinear limiting characteristic. The limiter is for limiting an amplitude of the main signal in the first signal obtained from the first output of the first 90 degree hybrid set 20. In this case, in the limiter, one end of the transducer 60a is used as an input, and one end of the transducer 60b is used as an output.

The other two transducers 60c and 60d, the magnetostatic wave element 62b and so on are used as a filter. Since the filter has the same structure as the above limiter, the filter has the same input-to-output characteristic as the above limiter. The filter is for passing a signal applied thereto. In this case, in the filter, one end of the transducer 60d is used as in input, and one end of the transducer 60c is used as an output.

Meanwhile, on the other main surface of the substrate 12, a C-shaped yoke 68 making of magnetic material is installed so as to fix the permanent magnets 66a and 66b applying a magnetic field to the magnetostatic wave elements 62a and 62b. The yoke 68 is for decreasing a magnetic reluctance between the permanent magnets 66a and 66b, and is for protecting the magnetostatic wave elements 62a and 62b, the permanent magnets 66a and 66b and so on.

Figure 5:
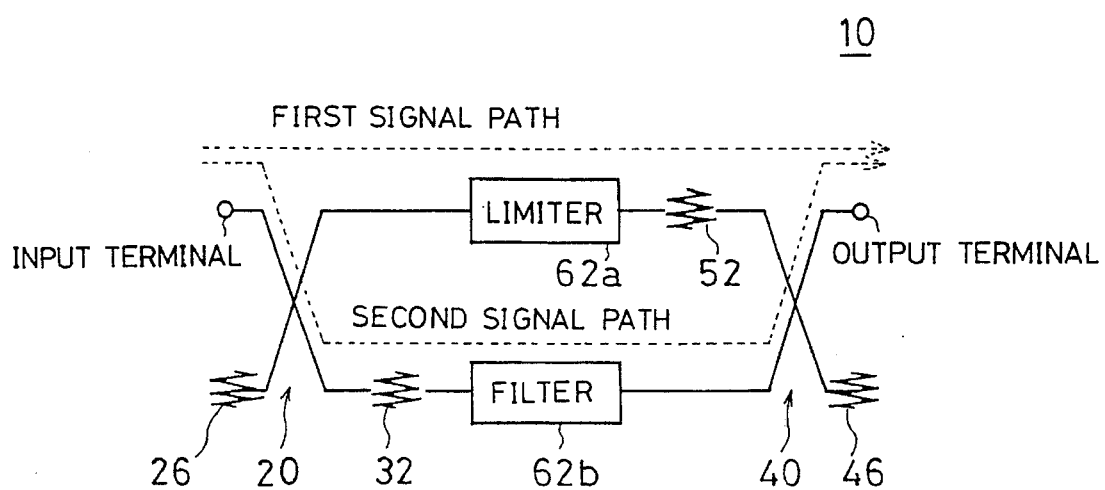
FIG. 5 is a circuit diagram of the embodiment shown in FIG. 1.

The signal-to-noise enhancer 10 has a circuit shown in FIG. 5. The signal-to-noise enhancer 10 has the first output of the first 90 degree hybrid set 20 connected to the input of the limiter comprising the magnetostatic wave element 62a. The second output of the first 90 degree hybrid set 20 is connected to the input of the filter comprising the magnetostatic wave element 62b via the resistor 32 functioning as the first attenuator. The output of the limiter is connected to the first input of the second 90 degree hybrid set 40 via the resistor 52 functioning as the second attenuator. Finally, the output of the filter is connected to the second input of the second 90 degree hybrid set 40.

Thus, in the signal-to-noise enhancer 10, between the input and the output, a first signal path is composed of the first 90 degree hybrid set 20, the limiter including the magnetostatic wave element 62a, the second attenuator consisting of the resistor 52 and the second 90 degree hybrid set 40, and a second signal path is composed of the first 90 degree hybrid set 20, the first attenuator consisting of the resistor 32, the filter including the magnetostatic wave element 62b and the second 90 degree hybrid set 40.

Next, the operation of the signal-to-noise enhancer 10 is described.

In the signal-to-noise enhancer 10, when an input signal including a main signal and low-level noise different in frequency from the main signal is applied to the input of the first 90 degree hybrid set 20, that is, the end portion 22a of the line electrode 22. The input signal is divided by the first 90 degree hybrid set 20 into a first signal and a second signal having a phase difference of 90 degree over a wide bandwidth of 1.4–2.4 GHz. In this case, the input signal is divided into the first signal and the second signal having half the level of the input signal at the first output and the second output of the first 90 degree hybrid set 20. Also, the first signal and the second signal respectively include the main signal and the low-level noise. Furthermore, the phase of the second signal is later than the phase of the first signal by 90 degrees.

The main signal in the first signal is limited by the limiter consisting of the magnetostatic wave element 62a and so on. On the other hand, the noise in the first signal is not limited by the limiter because the noise is different from the main signal in the first signal in frequency and has a low-level. However, due to insertion loss in the limiter, the first signal is slightly attenuated in level.

The second signal is attenuated by 30 dB in level by the first attenuator consisting of the resistor 32. The attenuated second signal is passed through the filter consisting of the magnetostatic wave element 62b and so on because the level thereof is low. The attenuated second signal is, however, slightly attenuated in level by insertion loss of the filter.

A signal obtained from the limiter is attenuated by 30 dB in level by the second attenuator consisting of the resistor 52. Then, a signal obtained from the second attenuator and a signal obtained from the filter are combined by the second 90 degree hybrid set 40 with a phase difference of 90 degree over a wide bandwidth of 1.4–2.4 GHz. In this case, levels of noise in the two signals combined by the second 90 degree hybrid set 40 in the first signal path and the second signal path are equalized by the first attenuator, the filter and the second attenuator as the level adjusting means. Furthermore, a phase difference between the two signals combined by the second 90 degree hybrid set 40 in the first signal path and the second signal path becomes 180 degree, that is, opposite in phase over a wide bandwidth due to operation of the first 90 degree hybrid set 20 and the second 90 degree hybrid set 40. Thus, the noise in the two signals combined by the second 90 degree hybrid set 40 in the first signal path and the second signal path are offset over a wide bandwidth. Furthermore, from the output of the second 90 degree hybrid set 40, the main signal having a level corresponding to the level limited by the limiter is obtained.

In the signal-to-noise enhancer 10, since the two signals combined by the second 90 degree hybrid set 40 in the first signal path and the second signal path are opposite in phase to each other over a wide bandwidth, an operating frequency bandwidth having a desired enhancement, for example, 20 dB or more over a wide bandwidth, for example, about 350 MHz is obtained. Thus, when the signal-to-noise enhancer 10 is used for receiving a satellite broadcasting signal, it can completely cover the bandwidth of about 300 MHz which is the bandwidth of all the satellite broadcasting signals received in Japan.

Also, in the signal-to-noise enhancer 10, since the operating frequency bandwidth is wide, when the temperature changes, even if the operating frequency bandwidth changes, the operating frequency bandwidth substantially maintains coverage of the specified frequencies of operation. Furthermore, it is easy to adjust the operating frequency bandwidth so that the specified frequency is within the operating frequency bandwidth. Only a short time is required to adjust the operating frequency bandwidth.

Furthermore, in the signal-to-noise enhancer 10, since the 90 degree hybrid sets are used as the first hybrid set and the second hybrid set, the same hybrid sets can be manufactured for the first hybrid set and the second hybrid set, the efficiency for manufacturing the first hybrid set and the second hybrid set is increased.

Also, in the signal-to-noise enhancer 10, since the magnetostatic wave element is used in the limiter, signals over a wide bandwidth is limited by the limiter, therefore, signals over a wide bandwidth can be applied.

Meanwhile in the signal-to-noise enhancer 10, since the magnetostatic wave element operates in the magnetostatic surface wave mode and is used as the limiter, the minimum level of the main signal limited by the limiter, that is, the saturation level of the limiter becomes low, thus, even if the level of the main signal is low, the signal-to-noise ratio in the input signal can be improved.

Furthermore, in the signal-to-noise enhancer 10, since the levels of the noise in the two signals combined by the second hybrid set are equalized by the level adjusting means consisting of the first attenuator, the filter and the second attenuator, the noise is reliably offset. Thus, the signal-to-noise ratio is reliably improved.

Figure 6:
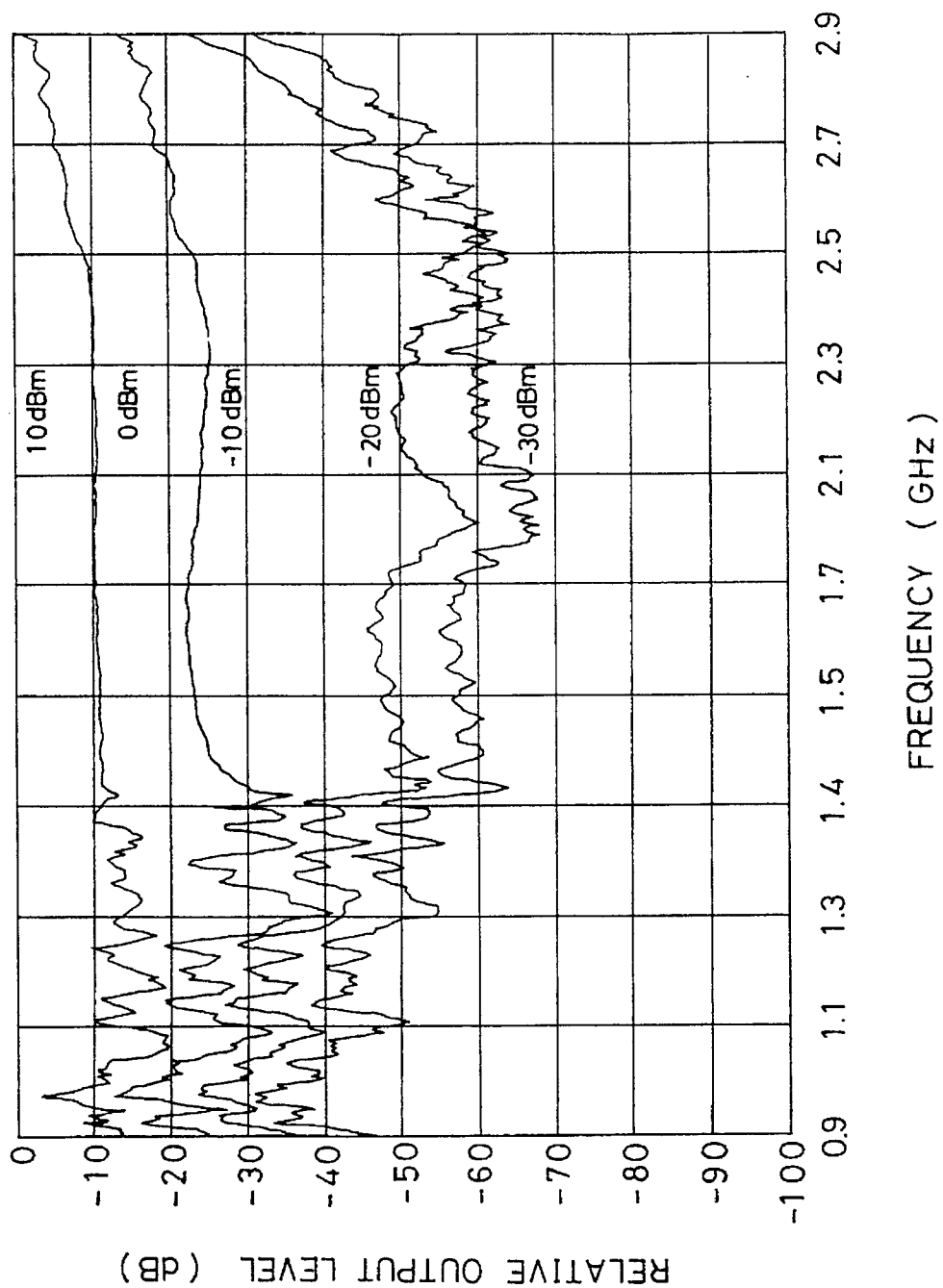
FIG. 6 is a graph showing transmission characteristics of the embodiment shown in FIG. 1 where a level of an input signal is decreased at an interval of 10 dB from 10 dBm as a reference.

That is, FIG. 6 shows transmission characteristics of the signal-to-noise enhancer 10 where a level of an input signal is decreased at an interval of 10 dB from 10 dBm as a reference. As it is apparent from the graph shown in FIG. 6, in the signal-to-noise enhancer 10, an enhancement of 10 dB is obtained over a wide bandwidth of about 600 MHz which is about 2 times of the conventional example, an enhancement of 20 dB is obtained over a wide bandwidth of about 350 MHz which is about 3.5 times of the conventional example.

Figure 7:
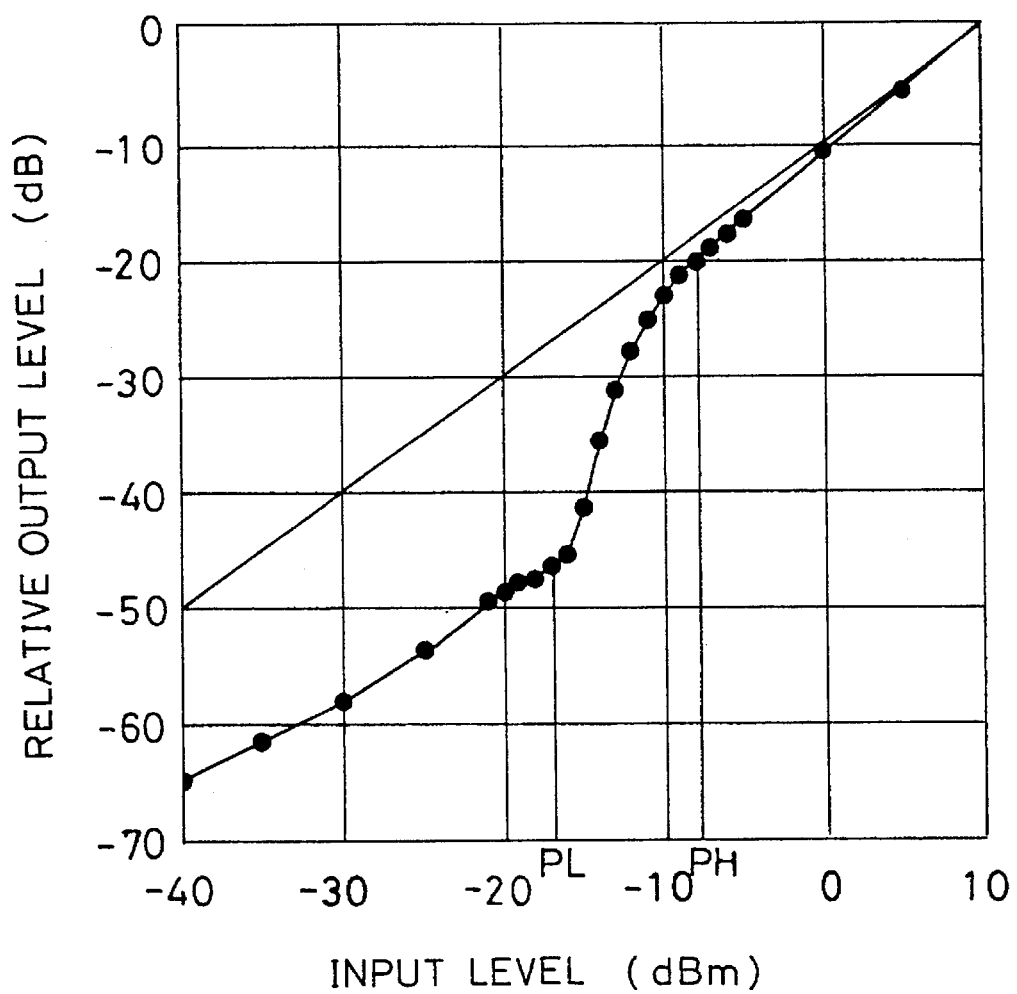
FIG. 7 is a graph showing an input-to-output characteristic at 1.9 GHz in the embodiment shown in FIG. 1.

FIG. 7 shows an input-to-output characteristic at 1.9 GHz in the signal-to-noise enhancer 10. As it is apparent from the graph shown in FIG. 7, in the signal-to-noise enhancer 10, the minimum level PH of the input signal wherein the signal-to-noise ratio is improved is −8 dBm, and the level PL of the input signal wherein it begins to improve the signal-to-noise ratio is −17 dBm, the difference between these levels is small as 9 dBm, therefore a great effect on improving of the signal-to-noise ratio can be obtained on receiving, for example, a satellite broadcasting signal.

Figure 8:
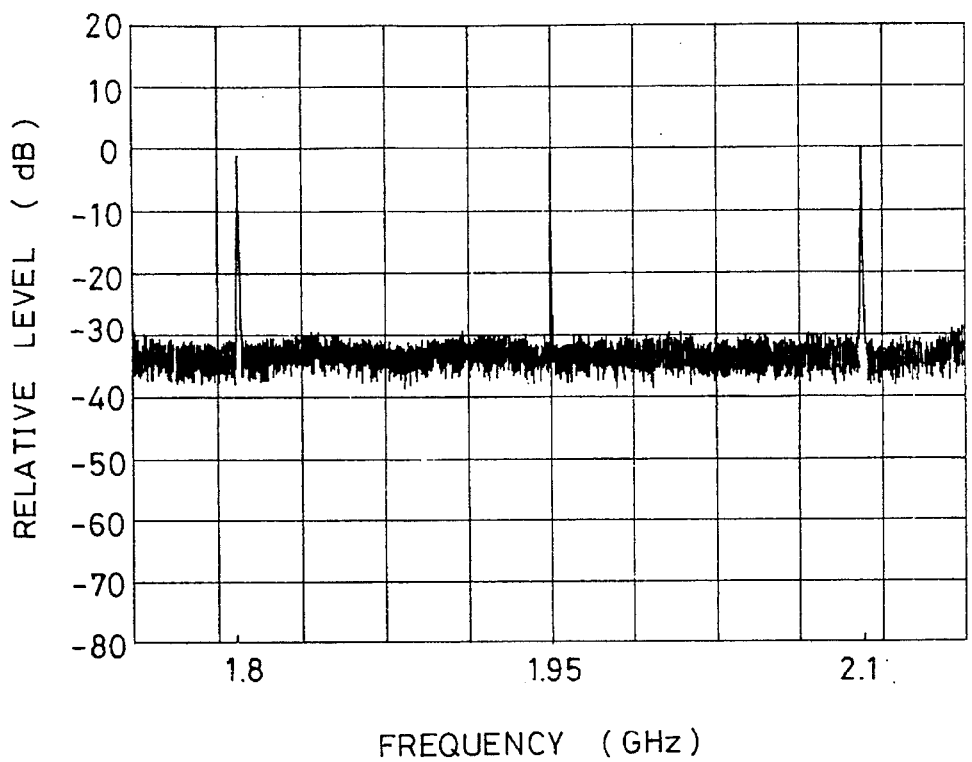
FIG. 8 is a graph showing one example of an input signal applied to the embodiment shown in FIG. 1.
Figure 9:
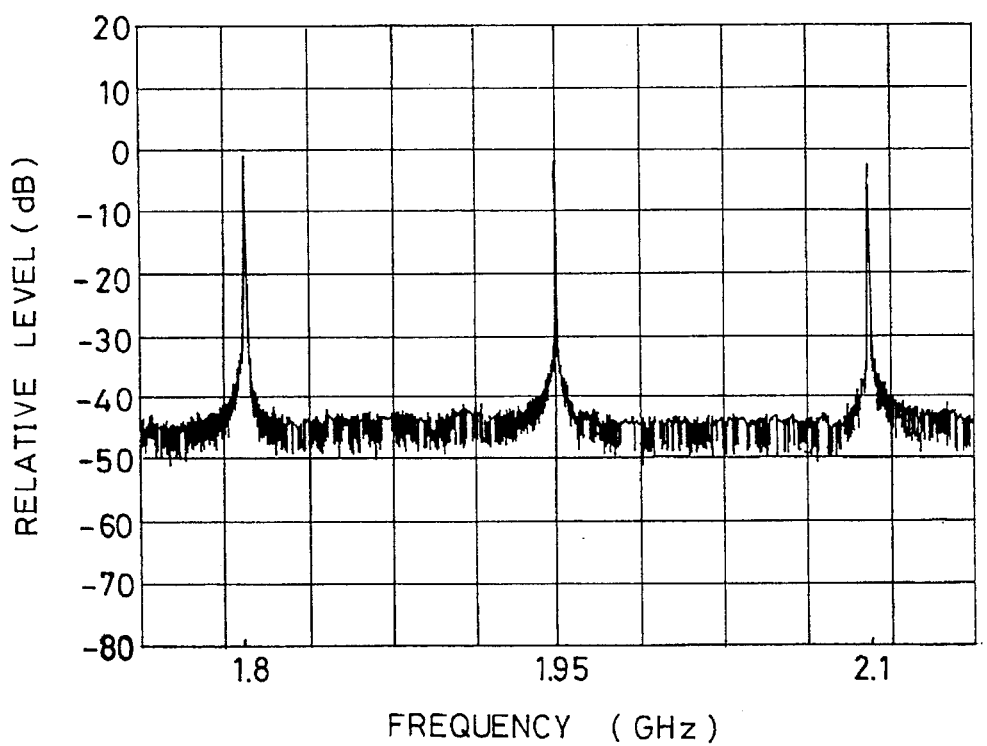
FIG. 9 is a graph showing an output signal obtained from the embodiment shown in FIG. 1 where the input signal shown in FIG. 8 is applied to the embodiment.

Furthermore, in the signal-to-noise enhancer 10, when the input signals include the three signals, 1.8 GHz, 1.95 GHz and 2.1 GHz with an input level of 0 dBm shown in FIG. 8, are applied at the same time, the output signals shown in FIG. 9 are obtained. As it is apparent from the graphs shown in FIG. 8 and FIG. 9, in the signal-to-noise enhancer 10, the noise is attenuated by 10 dB or more at 10 MHz separation from each signal, and the signal-to-noise enhancer operates separately to each signal.

Figure 10:
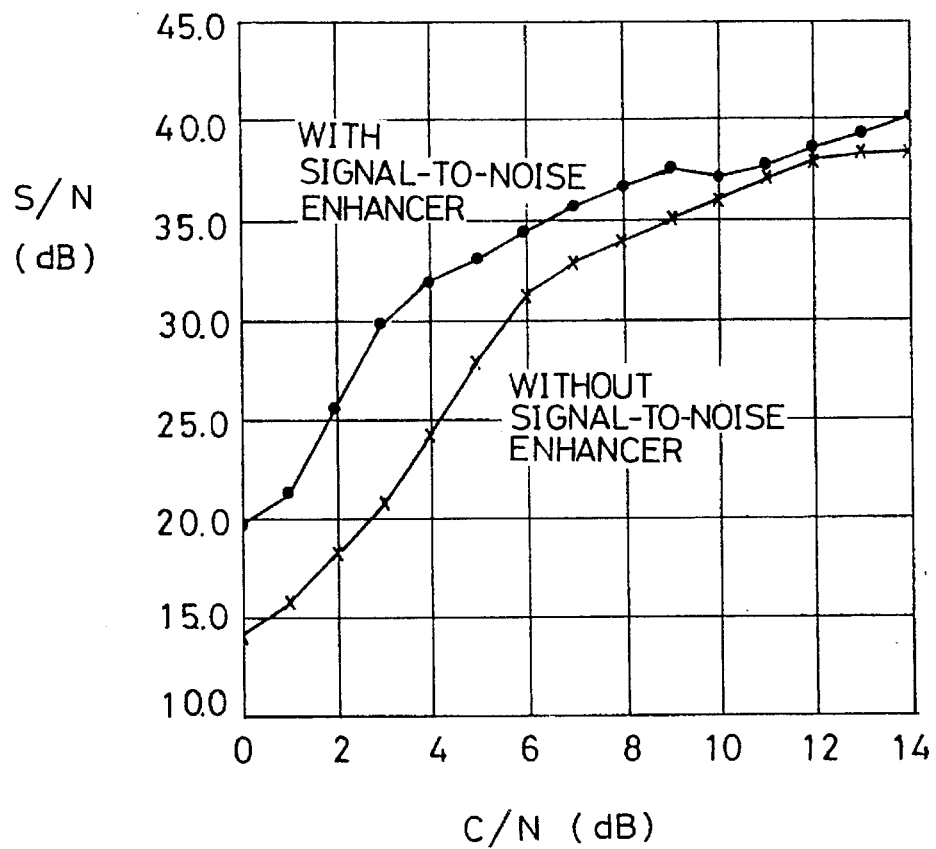
FIG. 10 is a graph showing relations between carrier-to-noise ratio and signal-to-noise ratio where the embodiment shown in FIG. 1 is used for receiving a satellite broadcasting signal and is not used.
Figure 11:
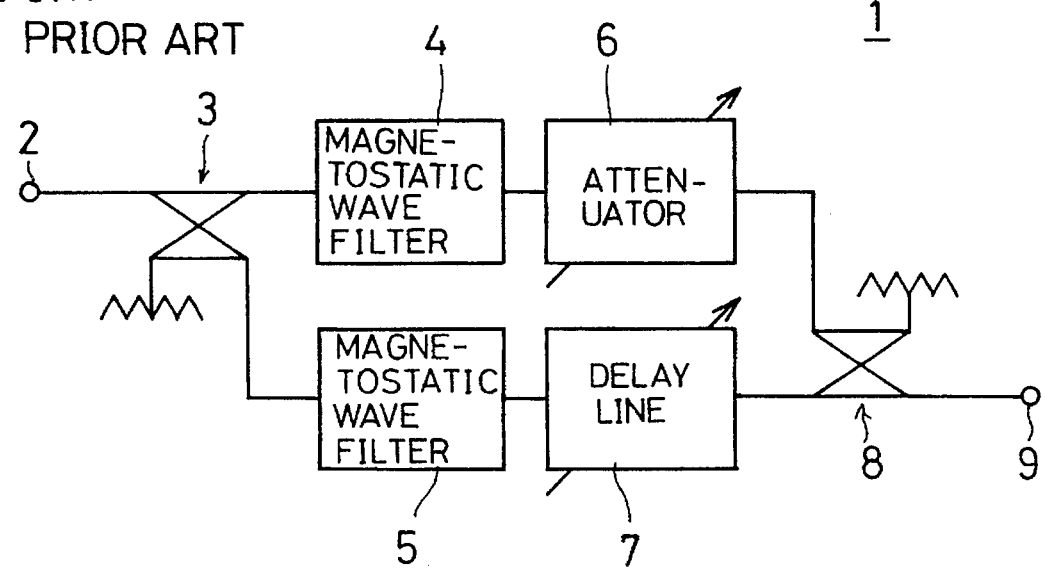
FIG. 11 is a circuit diagram showing an example of the conventional signal-to-noise enhancers.

FIG. 10 shows relations between carrier-to-noise ratio and signal-to-noise ratio where the signal- to-noise enhancer 10 is used for receiving a satellite broadcasting signal and is not used. In this case, the relations between the carrier-to-noise ratio and the signal-to-noise ratio are measured by using a video signal having an average picture level (APL) of 50%, that is, a video signal including a signal for white of 50% and a signal for black of 50%. As it is apparent from the graph shown in FIG. 10, when the signal-to-noise enhancer 10 is used for receiving the satellite broadcasting signal, compared with the case wherein the signal-to-noise enhancer is not used for receiving the satellite broadcasting signal, the signal-to-noise ratio is increased by 2–8 dB when the carrier-to-noise ratio is 9 dB or less, the signal-to-noise ratio can be increased by 0.5 dB when the carrier-to-noise ratio is 9 dB or more.

Meanwhile, though the 90 degree hybrid sets are used as the first hybrid set and the second hybrid set in the above-mentioned embodiment, in the present invention, a 0 degree hybrid set and a 180 degree hybrid set may be used, or a 180 degree hybrid set and a 0 degree hybrid set may be used. Meanwhile, for composing the 0 degree hybrid set or the 180 degree hybrid set, two 90 degree hybrid sets can be used taking account of these phases.

Also, though the magnetostatic wave element operates in the magnetostatic surface wave mode having a bandpass filter characteristic is used as the limiter in the above-mentioned embodiment, a magnetostatic wave element operating in the magnetostatic forward volume wave mode or the magnetostatic backward volume wave mode may be used, or a filter such as a low-pass filter utilizing a magnetostatic wave, a high-pass filter utilizing a magnetostatic wave and a bandstop filter utilizing a magnetostatic wave may be used.

Furthermore, though the first attenuator, the filter and the second attenuator are used as the level adjusting means in the above-mentioned embodiment, in place of providing the first attenuator and the second attenuator, an attenuator may be provided to the pre-stage of the first hybrid set, an amplifier may be provided to the pre-stage of the limiter, and an amplifier may be provided to the post-stage of the filter.

Or, each amplifier or each attenuator may be provided to the pre-stage of the the first hybrid set, the pre-stage and the post-stage of the limiter, and the pre-stage and the post-stage of the filter.

Meanwhile, "90 degree" and "180 degree" in the present invention include not only the literal degrees but also the approximate degrees in view of the objective, the action and the effect of the present invention.

It will be apparent from the foregoing that, while the present invention has been described in detail and illustrated, these are only particular illustrations and examples, and the present invention is not limited to these. The spirit and scope of the present invention is limited only by the appended claims.

What is claimed is:

1. A signal-to-noise enhancer comprising:

a first hybrid set for dividing an input signal including a main signal and noise into a first signal and a second signal, said first signal and said second signal having a first phase difference over a wide bandwidth;

a limiter, provided to the post-stage of said first hybrid set, for limiting an amplitude of said main signal in said first signal; and a second hybrid set, provided to the post-stage of said limiter and said first hybrid set, for combining a signal obtained from said limiter and said second signal obtained from said first hybrid set with a second phase difference over a wide bandwidth;

a sum of said first phase difference and said second phase difference being substantially (2n+1)·180 degrees wherein n is 0 or an integer;

a level adjusting means, provided between said first hybrid set and said second hybrid set, for equalizing levels of noise in said signals combined by said second hybrid set, said level adjusting means including:

a first attenuator, provided between said first hybrid set and said second hybrid set, for attenuating a level of said second signal obtained from said first hybrid set;

a filter, provided between said first attenuator and said second hybrid set, having the same input-to-output characteristic as said limiter, for passing a signal obtained from said first attenuator; and a second attenuator, provided between said limiter and said second hybrid set, for attenuating a level of said signal obtained from said limiter.

2. A signal-to-noise enhancer according to claim 1, wherein 90 degree hybrid sets comprise said first hybrid set and said second hybrid set.

3. A signal-to-noise enhancer according to claim 1, wherein said limiter includes a magnetostatic wave element.

4. A signal-to-noise enhancer according to claim 3, wherein said magnetostatic wave element operates in a magnetostatic surface wave mode.

5. A signal-to-noise enhancer comprising:

a first 90 degree hybrid set for dividing an input signal including a main signal and noise into a first signal and a second signal, said first signal and said second signal having a phase difference of 90 degree in a wide bandwidth;

a limiter, provided to the post-stage of said first 90 degree hybrid set, using a magnetostatic wave element utilized the magnetostatic surface wave mode, for limiting an amplitude of a main signal in said first signal;

a first attenuator, provided to the post-stage of said first 90 degree hybrid set, for attenuating a level of said second signal;

a filter, provided to the post-stage of said first attenuator, using a magnetostatic wave element utilized the magnetostatic surface wave mode, having the same input-to-output characteristic as said limiter, for passing a signal obtained from said first attenuator;

a second attenuator, provided to the post-stage of said limiter, for attenuating a level of a signal obtained from said limiter; and a second 90 degree hybrid set, provided to the post-stage of said second attenuator and said filter, for combining a signal obtained from said second attenuator and a signal obtained from said filter with a phase difference of 90 degree in a wide bandwidth, wherein levels of noises in two signals combined by said second 90 degree hybrid set are equalized by said first attenuator, said filter and said second attenuator, and a phase difference between said two signals combined by said second 90 degree hybrid set is set by said first 90 degree hybrid set and said second 90 degree hybrid set to (2n+1)·180 degree where n is 0 or an integer.

6. A signal-to-noise enhancer comprising:

a first hybrid set for dividing an input signal including a main signal and noise into a first signal and a second signal, said first signal and said second signal having a first phase difference over a wide bandwidth;

a limiter, provided to the post-stage of said first hybrid set, for limiting an amplitude of said main signal in said first signal;

a filter, provided to the post-stage of said first hybrid set, having the same input-to-output characteristic as said limiter, for passing said main signal in said second signal;

a second hybrid set, provided to the post-stage of said limiter and said filter, for combining a signal obtained from said limiter and a signal obtained from said filter with a second phase difference over a wide bandwidth;

a sum of said first phase difference and said second phase difference being substantially (2n+1)·180 degrees wherein n is 0 or an integer;

a first level adjusting means, provided to the post-stage of said first hybrid set and to the pre-stage of one of said said limiter and said filter, for adjusting a levels of the main signals in said one of said first signal and said second signal to set the level of the main signal in said first signal to a higher level than a level of the main signal in said second signal; and a second level adjusting means, provided to one of a post-stage of said limiter and said filter, and to the pre-stage of said second hybrid set, for equalizing levels of noise in said two signals combined by said second hybrid set either.

7. A signal-to-noise enhancer according to claim 6, wherein said first hybrid set and said second hybrid set each include a 90 degree hybrid.

8. A signal-to-noise enhancer according to claim 6, wherein said limiter is a magnetostatic wave element.

9. A signal-to-noise enhancer according to claim 8, wherein said magnetostatic wave element function in the magnetostatic surface wave mode.

* * * * *